United States Patent
Tanio

(10) Patent No.: US 12,088,256 B2
(45) Date of Patent: Sep. 10, 2024

(54) DOHERTY POWER AMPLIFIER

(71) Applicant: NEC Corporation, Tokyo (JP)

(72) Inventor: Masaaki Tanio, Tokyo (JP)

(73) Assignee: NEC CORPORATION, Tokyo (JP)

( * ) Notice: Subject to any disclaimer, the term of this patent is extended or adjusted under 35 U.S.C. 154(b) by 508 days.

(21) Appl. No.: 17/430,036

(22) PCT Filed: Feb. 12, 2020

(86) PCT No.: PCT/JP2020/005407
§ 371 (c)(1),
(2) Date: Aug. 11, 2021

(87) PCT Pub. No.: WO2020/166629
PCT Pub. Date: Aug. 20, 2020

(65) Prior Publication Data
US 2022/0360231 A1    Nov. 10, 2022

Related U.S. Application Data

(60) Provisional application No. 62/805,012, filed on Feb. 13, 2019.

(51) Int. Cl.
*H03F 1/02* (2006.01)
*H03F 1/22* (2006.01)
(Continued)

(52) U.S. Cl.
CPC ........... *H03F 1/0288* (2013.01); *H03F 1/223* (2013.01); *H03F 1/56* (2013.01); *H03F 3/193* (2013.01)

(58) Field of Classification Search
CPC .......... H03F 1/0288; H03F 1/223; H03F 1/56; H03F 3/193; H03F 2200/451
(Continued)

(56) References Cited

U.S. PATENT DOCUMENTS

2009/0206926 A1   8/2009   Horiguchi et al.
2010/0141338 A1   6/2010   Yu
(Continued)

FOREIGN PATENT DOCUMENTS

JP   2005-117599 A   4/2005
JP   2005-130013 A   5/2005

OTHER PUBLICATIONS

International Search Report for PCT Application No. PCT/JP2020/005407, mailed on Apr. 21, 2020.
(Continued)

*Primary Examiner* — Andrea Lindgren Baltzell
*Assistant Examiner* — Jose E Pinero
(74) *Attorney, Agent, or Firm* — Sughrue Mion, PLLC

(57) ABSTRACT

An input signal is input to a main power amplifier and an auxiliary power amplifier. A combiner is connected to an output of the main power amplifier and an output of the auxiliary power amplifier. The combiner includes an impedance converter, first and second lumped elements. The impedance converter is connected to a combining point. The first lumped element is connected between the output of the main power amplifier and the combining point. The second lumped element is connected between the output of the auxiliary power amplifier and the combining point. A line length between the output of the main power amplifier and the combining point is the same as that between a line length between the output of the auxiliary power amplifier and the combining point.

4 Claims, 14 Drawing Sheets

(51) Int. Cl.
  *H03F 1/56* (2006.01)
  *H03F 3/193* (2006.01)
(58) Field of Classification Search
  USPC .......................................................... 330/124
  See application file for complete search history.

(56) References Cited

U.S. PATENT DOCUMENTS

| | | | |
|---|---|---|---|
| 2011/0025412 | A1* | 2/2011 | Matsunaga .............. H03F 1/56 330/124 R |
| 2016/0164553 | A1 | 6/2016 | Kurihara |
| 2017/0005620 | A1 | 1/2017 | Hallberg et al. |

OTHER PUBLICATIONS

E. Kaymaksut et al., "Transformer-Based Doherty Power Amplifiers for mm-Wave Applications in 40-nm CMOS", IEEE TMTT. vol. 63, No. 4, pp. 1186-1192, Apr. 2015.

H. Hashemi et al., "mm-Wave Silicon Power Amplifiers and Transmitters", Cambridge. U.K, Cambridge Univ. Press, Apr. 2016, ISBN:9781107055865.

H.T. Nguyen et al., "A 62-to-68GHz linear 6Gb/s 64QAM CMOS Doherty radiator with 27.5%/20.1% PAE at peak/6dB-back-off output power leveraging high-efficiency multi-feed antenna-based active load modulation", IEEE ISSCC Dig. Tech. Papers, pp. 402-403, Feb. 2018.

M. Ozen et al., "Symmetrical Doherty Power Amplifier With Extended Efficiency Range", IEEE Transactions on Microwave Theory and Techniques, vol. 64, Issue 4, pp. 1273-1284, Apr. 2016.

N. Rostomyan et al., "28GHz Doherty Power Amplifier in CMOS SOI With 28% Backoff PAE", IEEE Microwave and Wireless Components Letters, vol. 28, Issue 5, pp. 446-448, May 2018.

J. Chen et al., "A Digitally Modulated mm-Wave Cartesian Beamforming Transmitter with Quadrature Spatial Combining". IEEE ISSCC Dig. Tech. Papers, pp. 232-234, Feb. 2013.

T. Chi et al., "A 60GHz On-Chip Linear Radiator with Single-Element 27.9dBm Psat and 33.1dBm Peak EIRP Using Multifeed Antenna for Direct On-Antenna Power Combining", IEEE ISSCC, pp. 296-298, Feb. 2017.

JP Office Action for JP Application No. 2021-545448, mailed on Oct. 11, 2022 with English Translation.

JP Office Communication for JP Application No. 2021-545448, mailed on May 16, 2023 with English Translation.

* cited by examiner

| | $V_1$ (V) | $I_1$ (mA) | $Z_1 = (1000V_1/I_1)$ (Ω) |
|---|---|---|---|
| Peak Power | $1.94e^{j2.00}$ | $38.7e^{j0.87}$ | $21.5+41.5j$ |
| 3dB Back-off (6dB in total) | $1.67e^{j2.01}$ | $29.1e^{j0.69}$ | $18.8+54.0j$ |

Fig. 2

| | $V_2$ (V) | $I_2$ (mA) | $Z_2=(1000V_2/I_2)$ (Ω) |
|---|---|---|---|
| Peak Power | $1.79e^{j2.01}$ | $34.7e^{j0.85}$ | $21.5+41.5j$ |
| 3dB Back-off (6dB in total) | — | — | $*-71.7j$ |

Fig. 3

|  | PA100 | NPL1 | NPL3 | NPL6 | NPL7 |
|---|---|---|---|---|---|
| Architecture | Extended symmetric Doherty | Doherty | Antenna based Doherty | Spatial IQ combining | On antenna power combiner |
| Frequency (GHz) | 61 | 72 | 62 | 60 | 60 |
| Psat (dBm) | 14 | 21 | 19.4 | 9.6 | 27.9 |
| PAE_Psat | 18.7 | 13.6 | 28.3 | 28.5 | 23.4 |
| PAE_6dB_BO | 20.4 | 7 | 20.1 | 14.25 | 6 |
| Technology | 45nm CMOS SOI | 40nm CMOS | 45nm CMOS SOI | 65nm CMOS | 45nm CMOS SOI |

Fig. 14

DOHERTY POWER AMPLIFIER

This application is a National Stage Entry of PCT/JP2020/005407 filed on Feb. 12, 2020, which claims priority from U.S. Provisional Application 62/805,012 filed on Feb. 13, 2019, the contents of all of which are incorporated herein by reference, in their entirety.

TECHNICAL FIELD

The present invention relates to a Doherty power amplifier.

BACKGROUND ART

Demand for drastically increased data rates in backhaul and Wi-Fi (Wireless Fidelity) access networks requires millimeter-wave communication due to the available wideband channels. In particular, the 60-GHz band (57-64 GHz) is available for unlicensed operation and has been standardized by IEEE (Institute of Electrical and Electronics Engineers) 802.11ad. Additionally, those who are interested in the 60-GHz band have extended it to unmanned automotive applications due to the low latency.

However, designing highly-efficient power amplifier is quite challenging at the 60-GHz band. Moreover, the average efficiency at the 60-GHz band is poor due to the losses of on-chip combiner networks. For example, a Doherty power amplifier has been demonstrated for millimeter-wave bands (Non-patent Literature 1). However, the 6-dB back-off efficiency thereof is 7% at 72-GHz. The limitations on load modulation techniques in millimeter-wave power amplifiers are severalfold. First, the quarter-wave transmission line required for Doherty-based load modulation introduces significant loss that causes back-off efficiency degradation (Non-patent Literature 2). Another deviation from the ideal Doherty power amplifier operation is due to the poor control on the load-line resistance at high frequency. When a load-line resistance at peak condition is $R_L$, the load-line resistance at 6-dB back-off is expressed by $2R_L$. However, since actual load impedances at the peak condition and 6-dB back-off for the millimeter-wave power amplifiers may differ significantly, the back-off efficiency is degraded.

Recently, to incorporate the loss of the transmission line, an antenna-based Doherty has been proposed (Non-patent Literature 3). Due to the specific structure in which the series combiner serves as antenna, the antenna-based Doherty achieves 20.1% of power-added efficiency (PAE) at 6-dB back-off. However, this approach has some practical challenges including difficulty of integration into larger arrays and a thermal sinking due to the restriction of antenna structures.

A symmetric Doherty power amplifier with extended back-off efficiency range has been proposed (Non-patent Literature 4). By using this approach, the combiner loss can be reduced for a millimeter-wave Doherty power amplifier (Non-patent Literature 5). Moreover, the design procedure incorporates the specific load impedances at both peak and 6-dB back-off in the design of the combiner. Therefore, load-pull data suggests an optimal combiner design that offers improvements in performance relative to an original Doherty power amplifier. However, the symmetric Doherty power amplifier design proposed by Non-patent Literature 4 suggests five lumped-elements in the combiner. Therefore, the combined losses of these elements in the millimeter-wave bands increase the layout complexity and lead to lower efficiency.

CITATION LIST

Non Patent Literature

NPL1: E. Kaymaksut et al., "Transformer-Based Doherty Power Amplifiers for mm-Wave Applications in 40-nm CMOS", IEEE TMTT, vol. 63, no. 4, pp. 1186-1192, April 2015.

NPL2: H. Hashemi, S. Raman, "mm-Wave Silicon Power Amplifiers and Transmitters", Cambridge, U.K, Cambridge Univ. Press, 2016.

NPL3: H. T. Nguyen, T. Chi, S. Li, H. Wang, "A 62-to-68 GHz linear 6 Gb/s 64QAM CMOS Doherty radiator with 27.5%/20.1% PAE at peak/6 dB-back-off output power leveraging high-efficiency multi-feed antenna-based active load modulation", IEEE ISSCC Dig. Tech. Papers, pp. 402-403, February 2018.

NPL4: M. Ozen, K. Andersson, and C. Fager, "Symmetrical Doherty Power Amplifier With Extended Efficiency Range", IEEE Transactions on Microwave Theory and Techniques, Volume 64, Issue 4, pp. 1273-1284, April 2016.

NPL5: N Rostomyan, M Ozen, P Asbeck, "28 GHz Doherty Power Amplifier in CMOS SOI With 28% Backoff PAE", IEEE Microwave and Wireless Components Letters, Volume 28, Issue 5, pp. 446-448, 2018.

NPL6: J. Chen et al., "A Digitally Modulated mm-Wave Cartesian Beamforming Transmitter with Quadrature Spatial Combining", IEEE ISSCC Dig. Tech. Papers, pp. 232-233, February 2013.

NPL7: T. Chi et al., "A 60 GHz On-Chip Linear Radiator with Single-Element 27.9 dBm Psat and 33.1 dBm Peak EIRP Using Multifeed Antenna for Direct On-Antenna Power Combining", IEEE ISSCC, pp. 296-297, February 2017.

SUMMARY OF INVENTION

Technical Problem

However, the above-described Doherty power amplifiers include a plurality of components and thereby size reduction is limited due to these components. In contrast to this, a compact Doherty power amplifier having high efficiency with a compact configuration has been required.

The present invention has been made in view of the above-mentioned problem, and an objective of the present invention is to provide a Doherty power amplifier having high efficiency with a compact configuration.

Solution to Problem

An aspect of the present invention is a Doherty power amplifier including: a main power amplifier, an input signal being input to the main power amplifier; an auxiliary power amplifier, the input signal being input to the auxiliary power amplifier; and a combiner connected to an output of the main power amplifier and an output of the auxiliary power amplifier; in which the combiner includes: an impedance converter connected to a combining point; a first lumped element connected between the output of the main power amplifier and the combining point; and a second lumped element connected between the output of the auxiliary power amplifier and the combining point, a line length between the output of the main power amplifier and the combining point is the same as that between a line length between the output of the auxiliary power amplifier and the combining point.

Advantageous Effects of Invention

According to the present invention, it is possible to provide a Doherty power amplifier having high efficiency with a compact configuration.

BRIEF DESCRIPTION OF DRAWINGS

FIG. 2 is a table showing simulation result when the basic power amplifier used as a main power amplifier;

FIG. 3 is a table showing simulation result when the basic power amplifier is used as the auxiliary power amplifier;

FIG. 14 is a table showing comparison of characteristics from 60 GHz to 80 GHz of the symmetric Doherty power amplifier according to the first example embodiment and other silicon-based mmW power amplifiers based on load modulation techniques.

DESCRIPTION OF EMBODIMENTS

Figure 1:
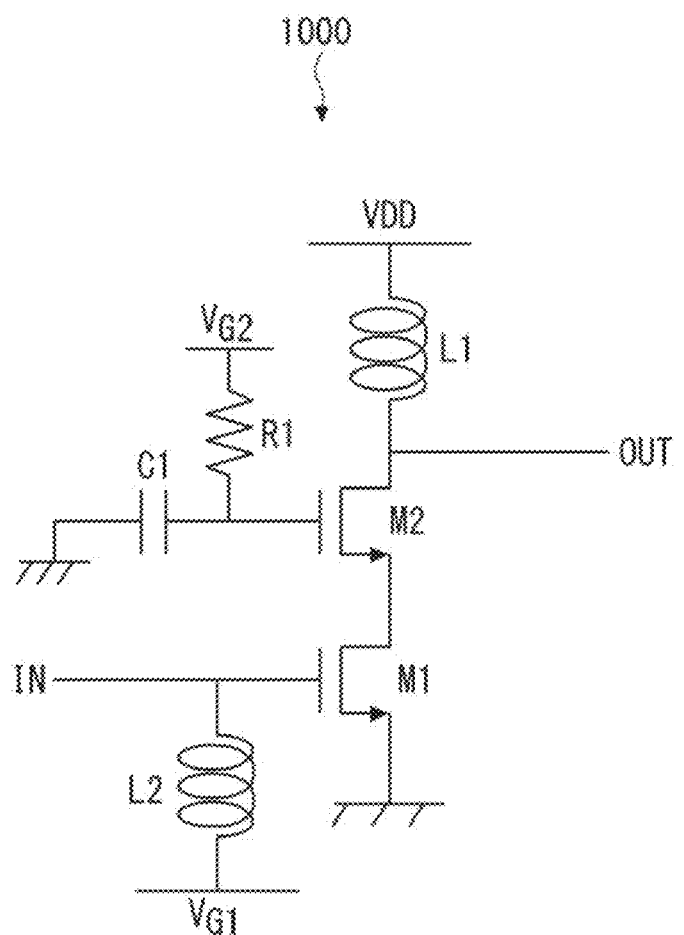
FIG. 1 schematically illustrates a configuration of a basic power amplifier incorporated in the Doherty power amplifier according to a first example embodiment.

Example embodiments of the present invention will be described below with reference to the drawings. In the drawings, the same elements are denoted by the same reference numerals, and thus a repeated description is omitted as needed.

Hereinafter, transistor design and its load-pull simulation, a general combiner and a combiner according to example embodiments will be described. Both the general combiner and the combiner according to example embodiments will be compared from the viewpoints of power-added efficiency (PAE) and loss.

First Example Embodiment

A Doherty power amplifier according to a first example embodiment that has a symmetric structure will be described. FIG. 1 schematically illustrates a configuration of a basic power amplifier 1000 incorporated in the Doherty power amplifier according to a first example embodiment. The basic power amplifier 1000 is configured to be capable of being applied to both main and auxiliary power amplifiers disposed in the Doherty power amplifier. The basic power amplifier 1000 has a configuration in which two FETs (Field Effect Transistors) are stacked. The power amplifier 10 includes FETs M1 and M2, a resistor R1, a capacitor C1, and inductors L1 and L2.

The inductor L1 (1 nH), the FETs M2 and M1 are connected in series in this order between a power source outputting a voltage VDD (2.0 V) and a ground. In this example, the FETs M1 and M2 are configured as Nch (N-channel) MOSFETs (Metal-Oxide-Semiconductor Field-Effect Transistors), and thereby the drain of the FET M2 is connected to one end of the inductor L1, the source of the FET M2 is connected to the drain of the FET M1, and the source of the FET M1 is connected to the ground.

On end of the resistor R1 is connected to a power source outputting a bias voltage $V_{G2}$ (1.4 V) and the other end thereof is connected to the gate of the FET M2 and one end of the capacitor C1 (500 fF). The other end of the capacitor C1 is grounded. Thus, the bias voltage $V_{G2}$ is applied to the gate of the FET M2. The inductor L2 (1 nH) is connected between the gate of the FET M1 and a power source outputting a bias voltage $V_{G1}$. Thus, the bias voltage $V_{G1}$ is applied to the gate of the FET M1.

In this configuration, an input terminal is derived from the gate of the FET M2 and an output terminal is derived from a node between the inductor L1 and the FET M2.

When the basic power amplifier 1000 is used as the main power amplifier, the bias voltage $V_{G1}$ is set as 0.3 V in order to bias the FET M1 close to class B operation. When the basic power amplifier 1000 is used as the auxiliary power amplifier, the bias voltage $V_{G1}$ is set as 0.1 V in order to bias the FET M1 close to class AB operation. Regardless of using as the main power amplifier or auxiliary power amplifier, the basic power amplifier 1000 can provide output power whose peak is 12 dBm.

To check the optimal load conditions for both the main and auxiliary power amplifiers, load-pull simulations are performed on the basic power amplifier 1000 at a peak power and a 3-dB back-off power. The simulations include EM (ElectroMagnetic) layout modelling of the transistor layout parasitic. FIGS. 2 and 3 are tables showing simulation results when the basic power amplifier 1000 is used as the main and auxiliary power amplifiers, respectively. In FIG. 2, $V_1$, $I_1$, and $Z_1$ denote an output voltage, an input current, and input impedance, respectively. In FIG. 3, $V_2$ and $I_2$ denote an output voltage and an input current, respectively. Note that, in FIG. 3, the column for $Z_2$ at the peak power is filled with input impedance, and the column for $Z_2$ at the 3-dB back off power is filled with output impedance.

Figure 4:
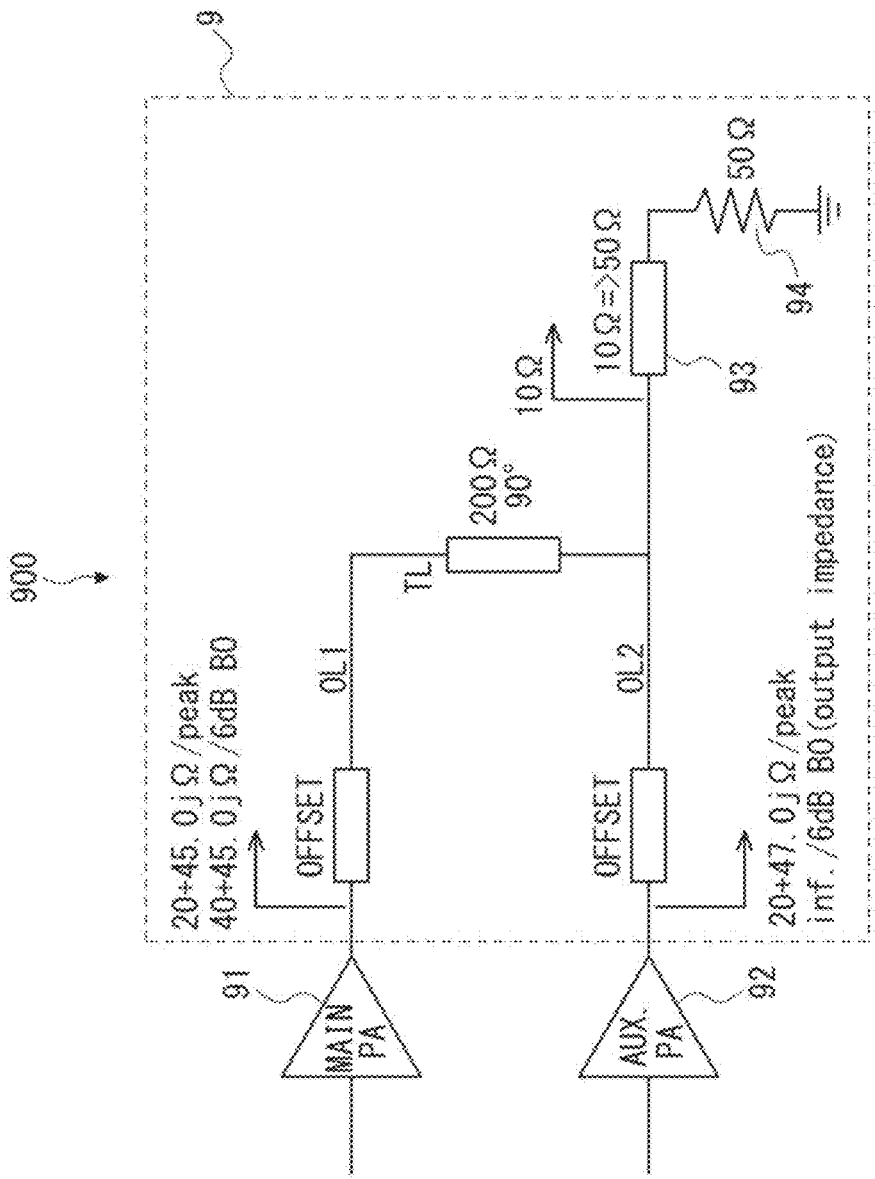
FIG. 4 schematically illustrates a configuration of a general Doherty power amplifier having a general combiner based on λ/4 transmission lines.

Hereinafter, the symmetric Doherty power amplifier 100 according to a first example embodiment that has a symmetric structure and includes the basic power amplifiers 1000 as the main and auxiliary power amplifiers will be described in detail. At first, in order to facilitate understanding an advantage of the symmetric Doherty power amplifier 100 according to the first example embodiment, a general Doherty power amplifier 900 having a general combiner 9 that is a comparative example will be described. FIG. 4 schematically illustrates a configuration of the general Doherty power amplifier 900 having the general combiner 9 based on λ/4 transmission lines. The general Doherty power amplifier 900 includes a main power amplifier 91, an auxiliary power amplifier 92, and the general combiner 9. The general combiner 9 includes offset lines OL1 and OL2, a λ/4 transmission line TL (200Ω, 90 degrees), and an impedance converter (10Ω=>50Ω) configured by an element 93 and resistor 94. The output of the main power amplifier 91 is connected to the impedance converter through the offset line OL1 and the λ/4 transmission line TL. The output of the auxiliary power amplifier 92 is connected to the impedance converter through the offset line OL2. The resistor 94 is connected between the element 93 and the ground.

When the load reactance is compensated by an offset line OL1 and OL2, the load resistance at the 6-dB back-off is to be set to twice the value at the peak power. Then, the load resistance at the peak power for both main and auxiliary power amplifiers are around 20Ω, the load resistance at the 6-dB back-off for the main power amplifier is around 40Ω. However, the 40Ω load-line prominently differs from the optimal resistance at the 6-dB back-off shown in the table of FIG. 2 (18.8Ω) and this result in a degradation in the 6-dB back-off PAE.

Figure 5:
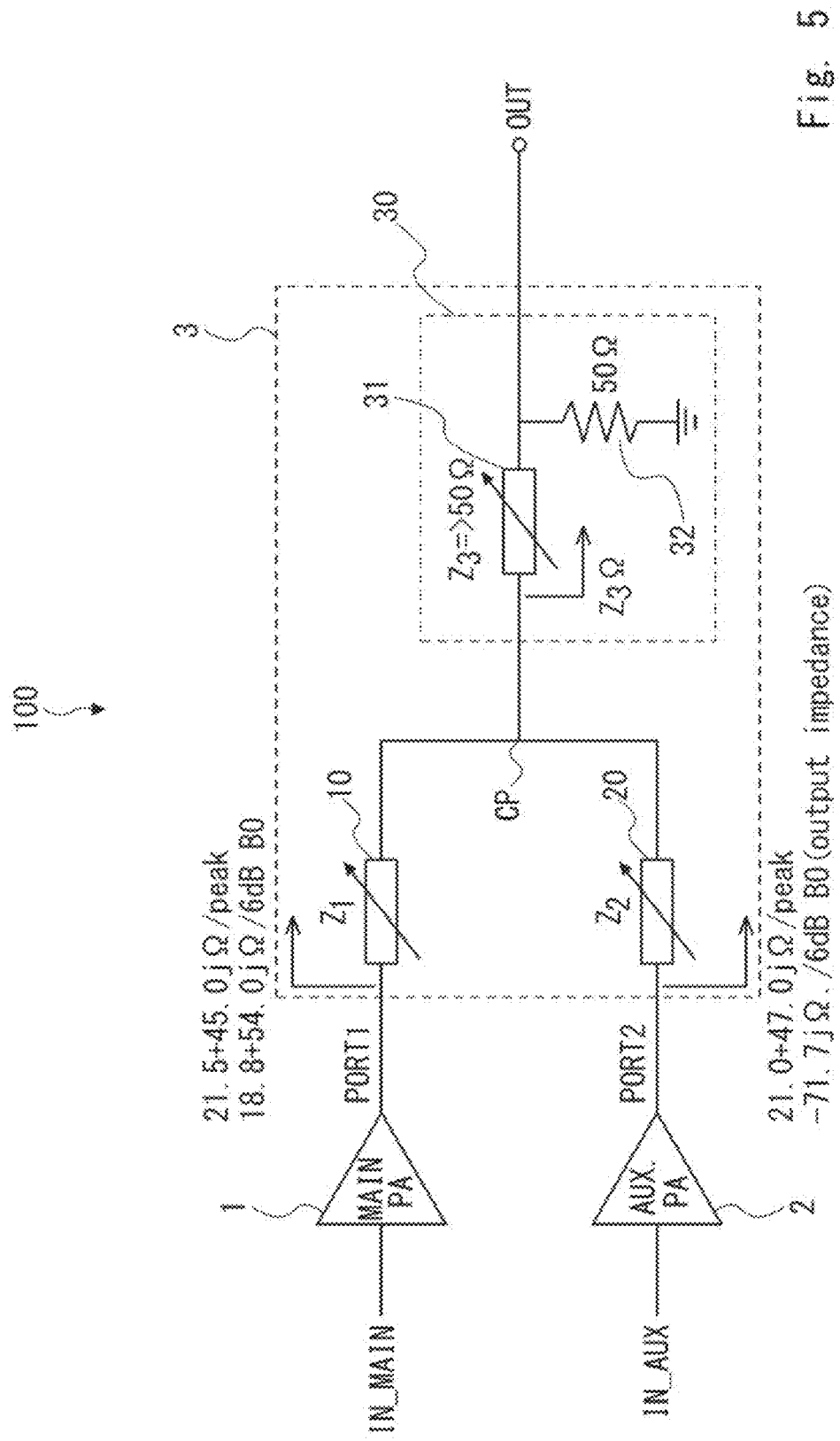
FIG. 5 schematically illustrates a configuration of a symmetric Doherty power amplifier according to the first example embodiment.

Next, a configuration of the symmetric Doherty power amplifier 100 according to a first example embodiment will be described. FIG. 5 schematically illustrates a configuration of the symmetric Doherty power amplifier 100 according to the first example embodiment. The symmetric Doherty power amplifier 100 includes a main power amplifier 1, an auxiliary power amplifier 2, and a symmetric combiner 3. Load-pull data (in the tables of FIGS. 2 and 3) is used for calculating combiner parameters in this case.

Generally, the symmetric combiner requires at least five free parameters (corresponding to 5 lumped elements) in order to obtain exact solutions for peak and 6-dB back-off efficiency. However, in the case of symmetric combiner 3, approximate solutions of the necessary impedance conditions may be valid to maintain high PAE. The approximations may drastically simplify the extended-range, symmetric Doherty. Thus, the symmetric combiner 3 includes only two lumped elements 10 and 20, and an impedance converter 3 providing load impedance.

The lumped element 10 is connected between the output of the main power amplifier 1 and a combining point CP. The lumped element 20 is connected between the output of the auxiliary power amplifier 2 and the combining point CP. The line length between the output of the main power amplifier 1 and the combining point CP is the same as that between the auxiliary power amplifier 2 and a combining point CP. In this case, impedance of the lumped element 10 (also referred to as a first lumped element) is $Z_1$ and impedance of the lumped element 20 (also referred to as a first lumped element) is $Z_2$.

The impedance converter 30 includes a lumped element 31 and resistor 32, for example. One end of the lumped element 31 is connected to the combining point CP. The other end of the lumped element 31 is connected to one end of the resistor 32 and an output terminal. The other end of the resistor 32 is grounded. The impedance converter 30 coverts impedance from $Z_3$ into 50Ω, for example.

Determination of the impedance $Z_1$, Z, and $Z_3$ will be described. In this configuration, an objective function f may be defined by the following expression:

(Expression 1)

$$f = \left| \frac{V_{1P}}{I_{1P}} - Z_{11} - Z_{12}\frac{I_{2P}}{I_{1P}}e^{-j\theta} \right|^2 + \left| \frac{V_{2P}}{I_{2P}} - Z_{21}\frac{I_{1P}}{I_{2P}}e^{j\theta} - Z_{22} \right|^2 + \left| \frac{V_{1B}}{I_{1B}} - Z_{11} + \frac{Z_{12}Z_{21}}{Z_{22} + Z_{2B}} \right|^2, \quad [1]$$

where $V_{1P}$, $I_{1P}$, $V_{1B}$, $I_{1B}$ are found in the table of FIG. 2 and $V_{2P}$, $I_{2P}$, $Z_{2B}$ are found in the table of FIG. 3, "V" denotes an output voltage of each power amplifier, "I" denotes an output current of each power amplifier, the subscript "1" denotes the main power amplifier, the subscript "2" denotes the auxiliary power amplifier, the subscript "P" denotes a situation at the peak power, and the subscript "B" denotes a situation at the 3-dB back-off power. A phase difference θ is maintained between the main and auxiliary power amplifier outputs. Terms $Z_{11}$, $Z_{12}$, $Z_{21}$ and $Z_{22}$ are the elements of Z-parameters for the symmetric combiner 3. In this case (in FIG. 5), since the symmetric combiner 3 includes the two lumped components of $Z_1$, $Z_2$ and the load $Z_3$, Z-parameters are expressed by the following expression:

(Expression 2)

$$\begin{pmatrix} Z_{11} & Z_{12} \\ Z_{21} & Z_{22} \end{pmatrix} = \begin{pmatrix} Z_1 + Z_3 & Z_3 \\ Z_3 & Z_2 + Z_3 \end{pmatrix}. \quad [2]$$

The first and second lines (the first and second terms of the right side) of Expression 1 correspond to a cost function for peak efficiency where a smaller value is better. The third line (the third term of the right side) of Expression 1 corresponds to a cost function for 6-dB back-off efficiency. By adding these cost functions and minimizing it, the optimized approximate parameters of $Z_1$, $Z_2$, $Z_3$, and θ for both peak and 6-dB back-off conditions can be obtained. Note that when f reaches zero, then the solution is mathematically equal to Non-patent Literature 4.

Input power control of the Doherty power amplifier will be described. In the general Doherty power amplifier, the highest back-off PAE is realized when the auxiliary power amplifier is completely turned off. In contrast to this, in the symmetric Doherty power amplifier 100 according to the present example embodiment, the input power control for both main and auxiliary power amplifiers is applied to enhance the turn-off of the auxiliary power amplifier. At X-dB back-off power (X is any real number), the main input power $P_{M\_in}$ and auxiliary input power $P_{A\_in}$ are controlled as follows:

I. When X=0, $P_{M\_in} = P_{A\_in}$
II. When 0<X<6, $P_{M\_in} - P_{A\_in} = 2X/3$ dB
III. When X>6, $P_{M\_in} - P_{A\_in} = 4$ dB.

These power relationships between $P_{M\_in}$ and $P_{A\_in}$ enhance the turn-off of the auxiliary power amplifier under the deep back-off conditions. Accordingly, this approach requires the input power control which is applied to the following simulation and measurement results.

Here, combiner loss and PAE will be compared. The transmission lines in the general combiner 9 are transformed to lumped L-C-L elements in the same manner as Non-patent Literature 5. Then, all components in both the symmetric combiner 3 and general combiner 9 can be arranged as lumped element networks to compare the prior approach to the proposed approximate impedance result.

Figure 6:
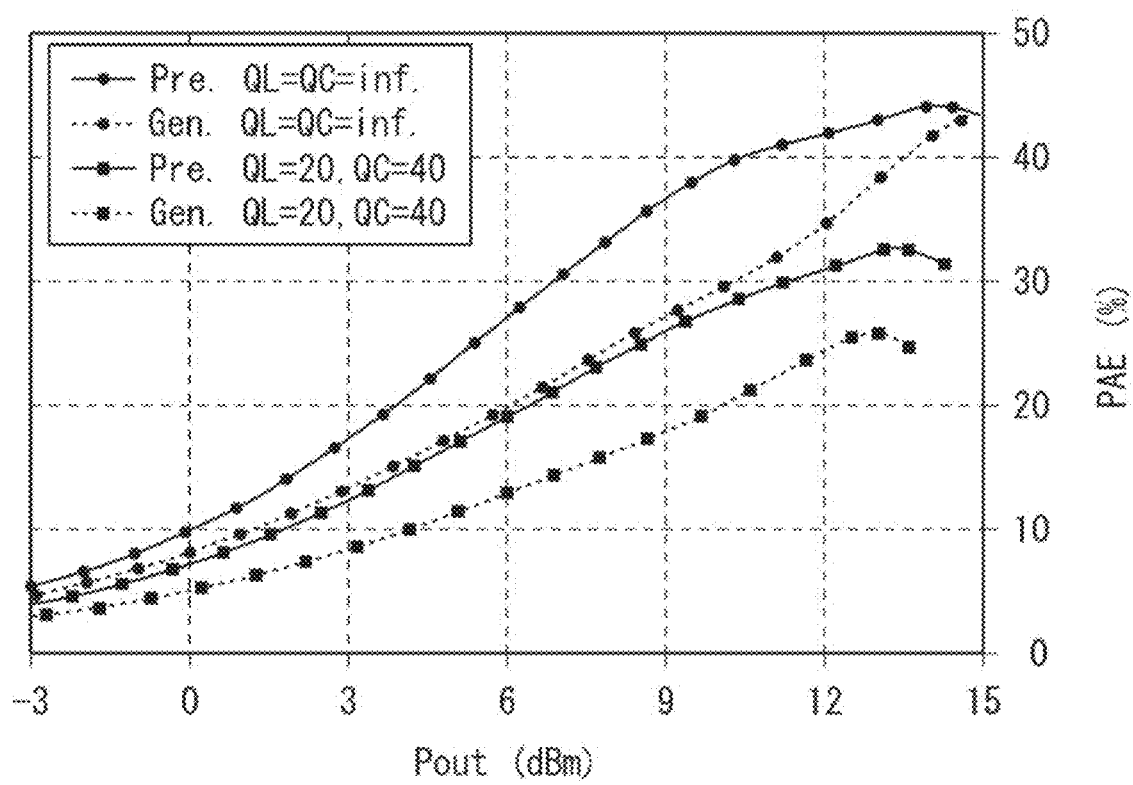
FIG. 6 illustrates simulated PAE as a function of Pout with the general combiner and asymmetric combiner according to the first example embodiment.

FIG. 6 illustrates the simulated PAE as a function of Pout with the general combiner 9 and the symmetric combiner 3 according to the present example embodiment. The dashed lines (Gen.) indicate the simulated PAEs in the general combiner 9, and the solid lines (Present configuration: Pre.) indicate the simulated PAEs in the symmetric combiner 3. The lines with circle markers are at a condition in which the lumped elements $Q_L$ and $Q_C$ are infinite, and the lines with square markers are at a condition in which the lumped element $Q_L=20$ and the lumped element $Q_C=40$ at 60-GHz. Comparing the solid lines and the dashed lines, the symmetric combiner 3 indicated by the solid lines achieves the PAE approximate to an ideal Doherty power amplifier efficiency curve. On the other hand, the general combiner 9 indicated by the dashed lines demonstrates poor back-off efficiency.

Figure 7:
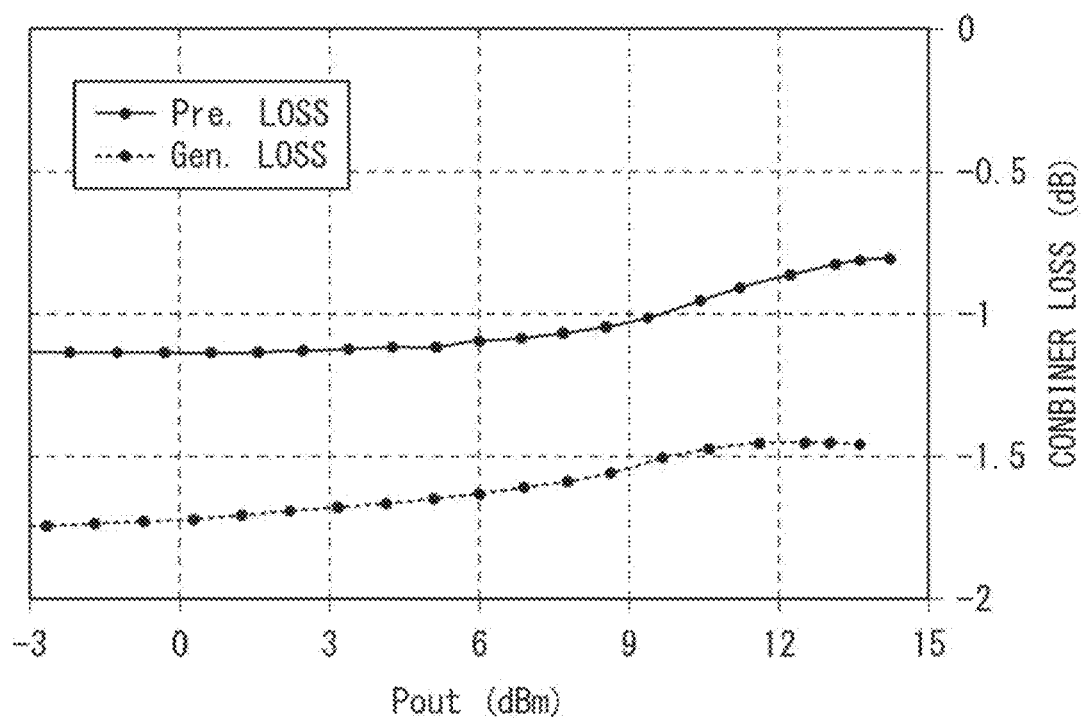
FIG. 7 illustrates simulated losses in the symmetric combiner and the general combiner versus Pout.

FIG. 7 illustrates simulated losses in the symmetric combiner 3 and the general combiner 9 versus Pout. In FIG. 7, it is assumed that $Q_L=20$ and $Q_C=40$, including losses of impedance converter. When $Q_L=20$ and $Q_C=40$ at 60-GHz, it is verified that the loss of the symmetric combiner 3 is lower than that of the general combiner 9 as illustrated in FIG. 6 and the PAE of the symmetric combiner 3 (Solid line, "Pre." in FIG. 7) is greater than that of the general combiner 9 (Dashed line, "Gen." in FIG. 7).

Figure 8:
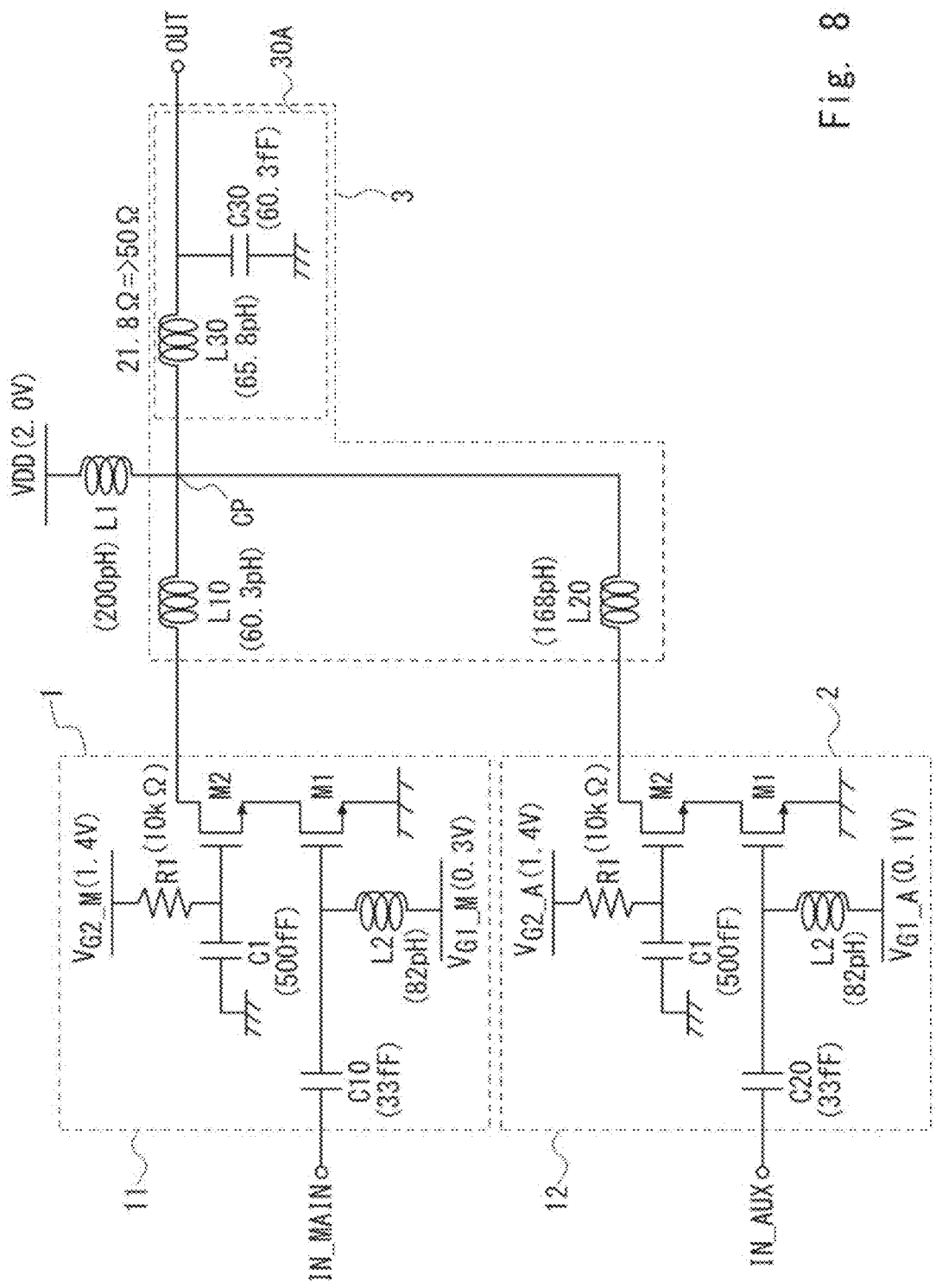
FIG. 8 illustrates a detailed configuration of the symmetric Doherty power amplifier according to the first example embodiment.

FIG. 8 illustrates a detailed configuration of the symmetric Doherty power amplifier 100 according to the first example embodiment. The main power amplifier 1 and the auxiliary power amplifier 2 have a similar configuration as the basic power amplifier 1000. However, an input capacitor C10 (33 fF) between the input IN_MAIN and the gate of the FET M1 in the main power amplifier 1, and an input capacitor C20 (33 fF) between the input IN_AUX and the gate of the FET M1 in the auxiliary power amplifier 2 are added. The resistor R1 is 10 kΩ, the capacitor C1 is 500 fF, and the inductor L2 is 82 pH in both the main power amplifier 1 and the auxiliary power amplifier 2. The inductor L1 (200 pH) is shared by the main power amplifier 1 and the auxiliary power amplifier 2. In the main power amplifier 1, the bias voltage $V_{G1\_M}$ is 0.3 V and the bias voltage $V_{G2\_M}$ is 1.4 V. In the auxiliary power amplifier 2, the bias voltage $V_{G1\_A}$ is 0.1 V and the bias voltage $V_{G2\_A}$ is 1.4 V. The power source voltage VDD is 2.0 V.

The symmetric combiner 3 includes inductors L10, L20, L30 and capacitor C30. The inductor L30 and capacitor C30 constitute the impedance converter 30A that is an alternative of the impedance converter 30.

One end of the inductor L10 (60.3 pH) is connected to the drain of the FET M2 in the main power amplifier 1. One end of the inductor L20 (168 pH) is connected to the drain of the FET M2 in the auxiliary power amplifier 2. The other ends of the inductors L10 and L20 are connected to the combining point CP. Thus, the inductors L10 and L20 correspond to the lumped elements 10 and 20, respectively.

One end of the inductor L30 (65.8 pH) is connected to the combining point CP. The other end of the inductor L30 (65.8 pH) is connected to the output terminal and connected to the ground through the capacitor C30 (60.3 fF). The inductor L30 and the capacitor C30 constitute an impedance converter from 21.8Ω to 50Ω. Thus, the inductor L30 corresponds to the lumped element 30 and the resistor 31 is replaced with the capacitor C30. The parameters in the symmetric combiner 3 are calculated as described above and the phase difference is 0 calculated as 90.6°.

Figure 9:
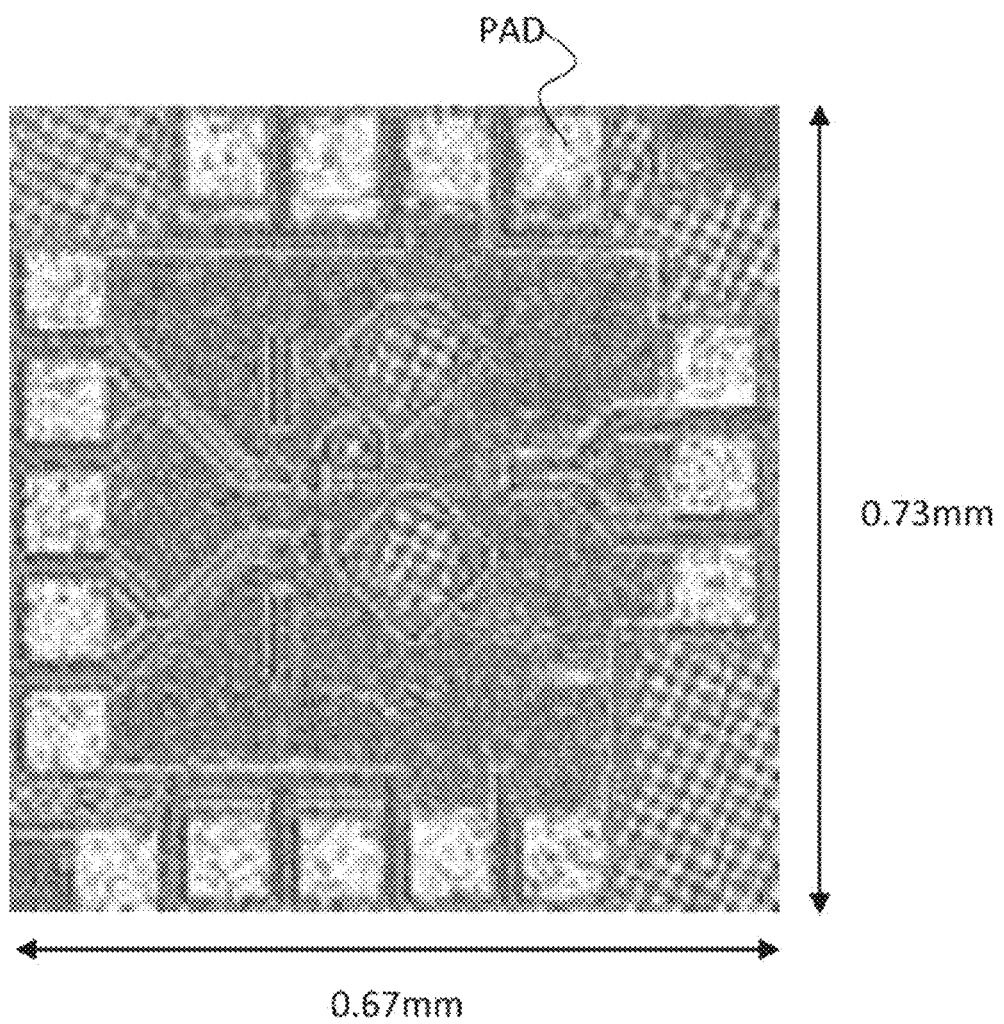
FIG. 9 is a top view of a chip including the symmetric Doherty power amplifier according to the first example embodiment.

In this case, the symmetric Doherty power amplifier 100 is fabricated in GlobalFoundries (GF) 45 nm CMOS (Complementary Metal Oxide Semiconductor) SOI (Silicon on Insulator) and has a dimension of 0.49 mm² (0.67 mm×0.73 mm) including the pads. FIG. 9 is a top view of a chip including the symmetric Doherty power amplifier 100.

Figure 10:
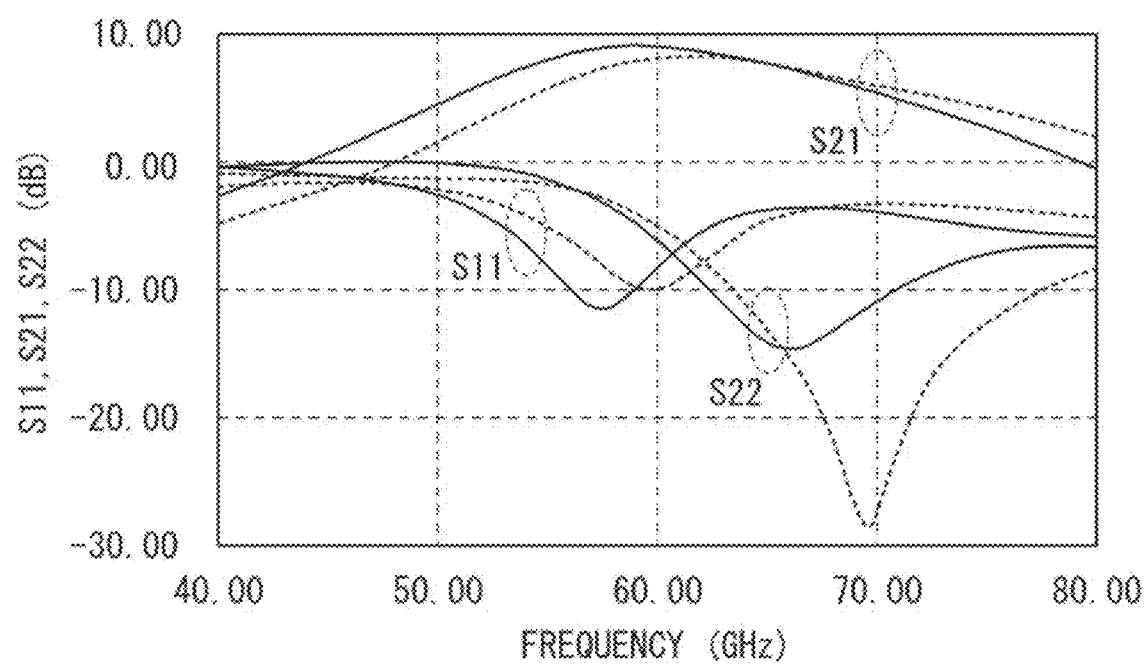
FIG. 10 illustrates measured S-parameters $S_{11}$, $S_{21}$, and $S_{22}$ of the main power amplifier according to the first example embodiment.

FIG. 10 illustrates measured S-parameters $S_{11}$, $S_{21}$, and $S_{22}$ of the main power amplifier 1. In the S-parameter measurement, the voltage conditions are the same as the case of FIG. 8. The input signal is provided to the input IN_MIAN of the main power amplifier 1 and the input IN_AUX of the auxiliary power amplifier 2 is opened. Although the center frequency is shifted a little higher from 59 GHz (simulated) to 61 GHz (measured), the measured S-parameters are similar to those of the simulation. The peak gain of the S-parameter $S_{21}$ is 9.0 dB at 59 GHz and the measured peak gain thereof is 8.3 dB at 61 GHz.

Figure 11:
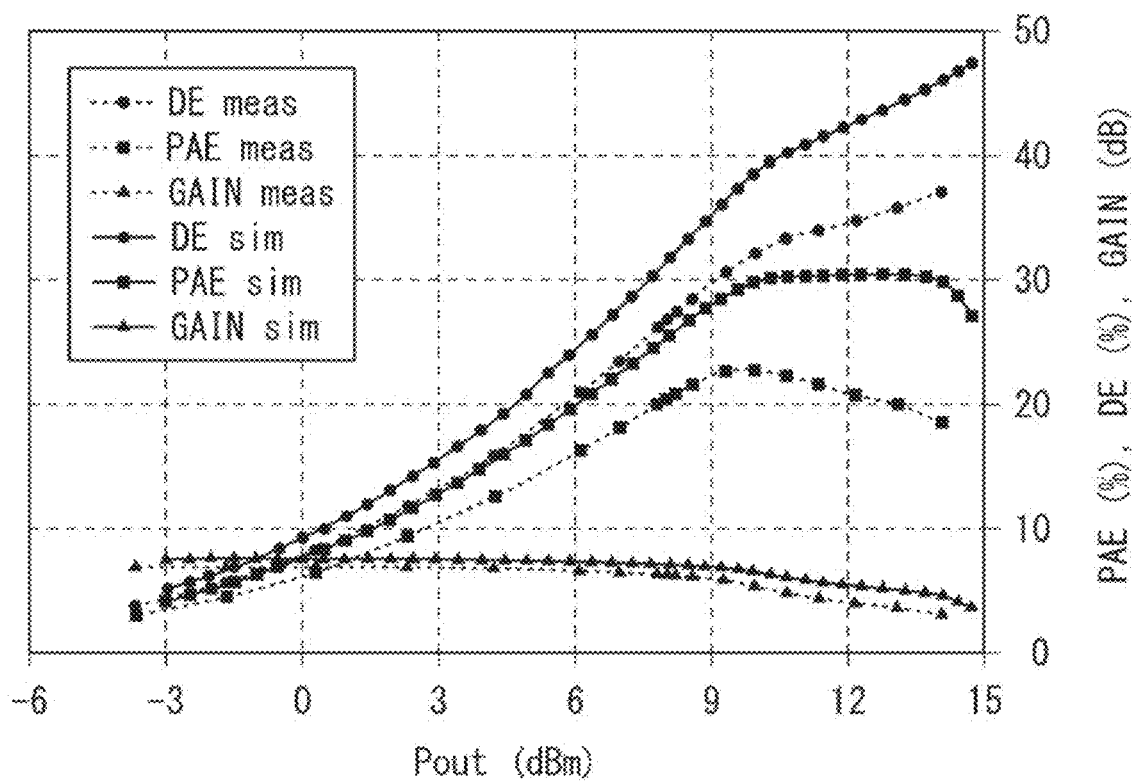
FIG. 11 illustrates simulated and measured large-signal characteristics of the Doherty power amplifier according to the first example embodiment at 59-GHz (simulated) and 61-GHz (measured)
Figure 12:
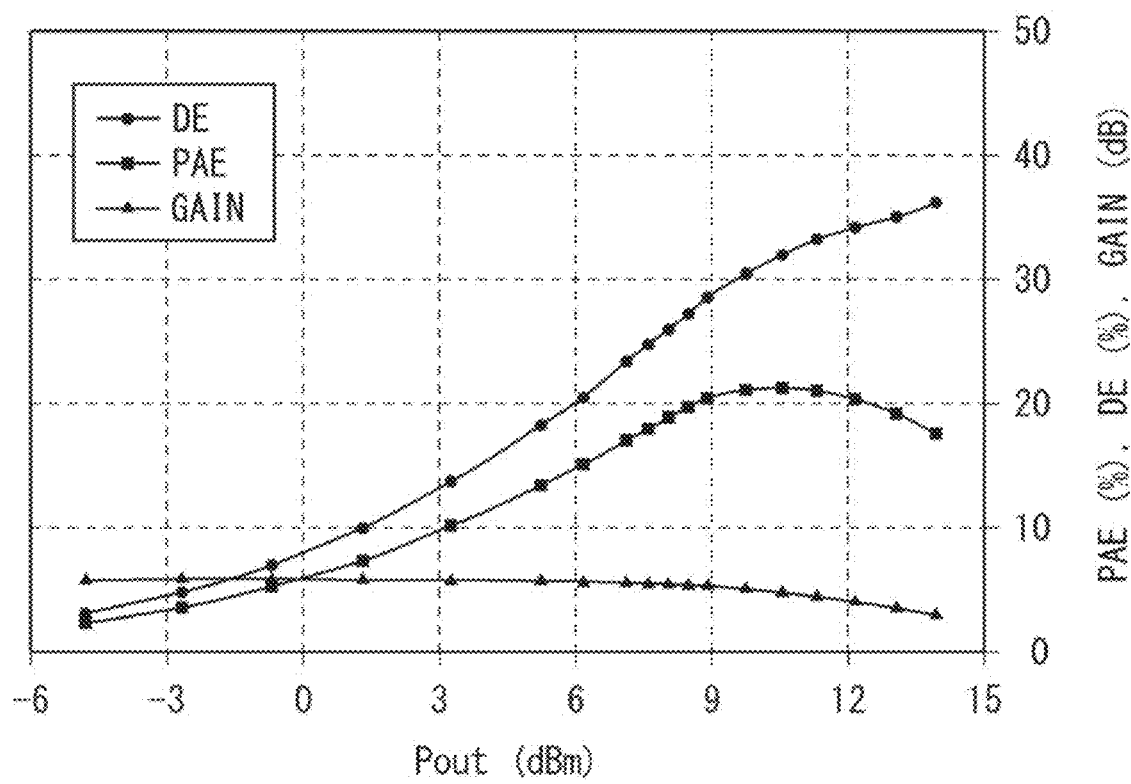
FIG. 12 illustrates the large-signal characteristics at 59 GHz.
Figure 13:
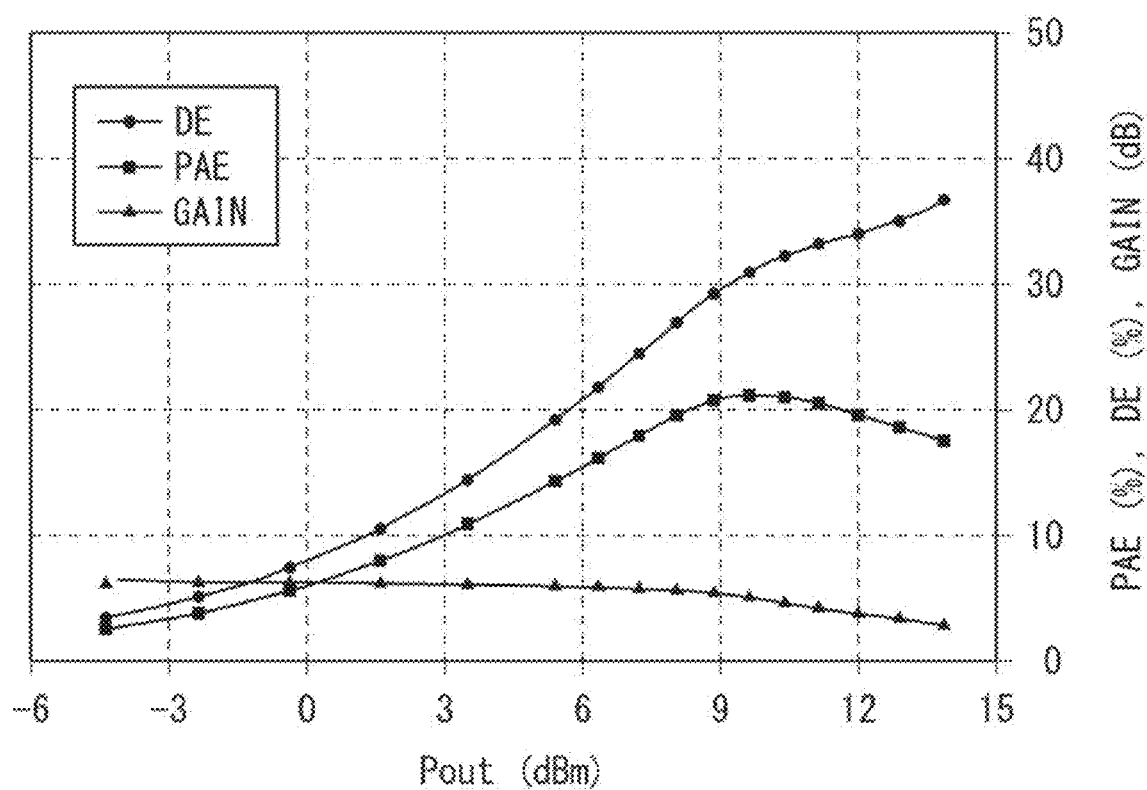
FIG. 13 illustrates the large-signal characteristics at 63 GHz.

FIG. 11 illustrates simulated and measured large-signal characteristics of the Doherty power amplifier at 59-GHz (simulated) and 61-GHz (measured). Compared with the simulated gain (thin lines), the measured gain (solid lines) degrades about 1-dB, which affects the measured DE (drain efficiency) and PAE. However, the measured performance can be considered as good. The measured power amplifier achieves 14.0 dBm saturated output power with 18.7% PAE and 20.4% PAE at 6-dB back-off. In general, 20.4% PAE at 6-dB back-off may be considered as the highest back-off PAE for a 60-GHz band. FIGS. 12 and 13 illustrate the large-signal characteristics at 59 GHz and 63 GHz, respectively. The PAE at 6-dB back-off in FIG. 12 (at 59 GHz) is 18.7% and that in FIG. 13 (63-GHz) 19.5% in FIG. 13. These also verify the wideband characteristics of the symmetric Doherty power amplifier 100 in the range from 59 to 63 GHz.

FIG. 14 is a table showing comparison of characteristics from 60 GHz to 80 GHz of the symmetric Doherty power amplifier 100 and other silicon-based mmW power amplifiers based on load modulation techniques. The symmetric Doherty power amplifier 100 achieves high PAE at back-off with the compact symmetric combiner 3 configured by only two inductors L10 and L20 (except for the inductor L30 in the impedance converter), which leads to compact size and improved efficiency. In particular, the small layout can alleviate the difficulty of incorporate the Doherty power amplifier into a phased-array and/or a massive MIMO (Multiple-Input and Multiple-Output) system.

As described above, the symmetric combiner 3 with reduced number of components can be achieved by the symmetric Doherty power amplifier 100. Thus, the symmetric Doherty power amplifier 100 achieves higher peak and average efficiency due to the lower combiner loss. Implementation of the symmetric Doherty power amplifier 100 in the 45 nm CMOS SOI at 60-GHz demonstrates the peak power of 14 dBm and the PAE of 20.4% at 6-dB back-off.

Other Example Embodiments

Note that the present invention is not limited to the above example embodiments and can be modified as appropriate without departing from the scope of the invention. For example, in the above example embodiment, the FETs M1 and M2 are configured as the Nch MOSFET. However, the FETs M1 and M2 may be configured as Pch (P-channele) MOSFET as appropriate. Further, the FETs M1 and M2 may be configured as any type transistor other than MOSFET as appropriate.

While the present invention has been described above with reference to example embodiments, the present invention is not limited to the above example embodiments. The configuration and details of the present invention can be modified in various ways which can be understood by those skilled in the art within the scope of the invention.

This application is based upon and claims the benefit of priority from U.S. provisional patent application No. 62/805,012, filed on Feb. 13, 2019, the disclosure of which is incorporated herein in its entirety by reference.

REFERENCE SIGNS LIST 1, 91 MAIN POWER AMPLIFIERS
2, 92 AUXILIARY POWER AMPLIFIERS
3 SYMMETRIC COMBINER
9 GENERAL COMBINER
10, 20, 31 LUMPED ELEMENTS
30, 30A IMPEDANCE CONVERTERS
32, 94, R1 RESISTORS
93 ELEMENT
100 SYMMETRIC DOHERTY POWER AMPLIFIER
900 GENERAL DOHERTY POWER AMPLIFIER
1000 BASIC POWER AMPLIFIER
C1, C10, C20, C30 CAPACITORS
M1, M2 FETs
L1, L2, L10, L20, L30 INDUCTORS
TL TRANSMISSION LINE
OL1, OL2 OFFSET LINES

What is claimed is:

1. A Doherty power amplifier comprising:
a main power amplifier, an input signal being input to the main power amplifier;
an auxiliary power amplifier, the input signal being input to the auxiliary power amplifier; and
a combiner connected to an output of the main power amplifier and an output of the auxiliary power amplifier; wherein
the combiner comprises:
an impedance converter connected between a combining point and an output terminal;
a first lumped element connected between the output of the main power amplifier and the combining point; and
a second lumped element connected between the output of the auxiliary power amplifier and the combining point,
the impedance converter comprises:
a third lumped element connected between the combining point and the output terminal; and
a fourth lumped element, one end of the fourth lumped element being connected to a node between the third lumped element and the output terminal, the other end of the fourth lumped element being grounded, and
a line length between the output of the main power amplifier and the combining point is the same as that between a line length between the output of the auxiliary power amplifier and the combining point.

2. The Doherty power amplifier according to claim 1, wherein
impedance $Z_1$ of the first lumped element, impedance $Z_2$ of the second lumped element, and impedance $Z_3$ of the impedance converter are determined using $Z_{11}$, $Z_{12}$, $Z_{21}$, and $Z_{22}$ of an objective function f, where $Z_{11}$, $Z_{12}$, $Z_{21}$ and $Z_{22}$ are elements of Z-parameters for the combiner, and
the objective function f is expressed by the following expressions, where V denotes an output voltage of the main or auxiliary amplifier, I denotes an output current of the main or auxiliary amplifier, a subscript 1 denotes the main power amplifier, a subscript 2 denotes the auxiliary power amplifier, a subscript P denotes a condition at a peak power, and a subscript B denotes a condition at 3-dB back-off power, (Expression 1)
$$f = \left| \frac{V_{1P}}{I_{1P}} - Z_{11} - Z_{12} \frac{I_{2P}}{I_{1P}} e^{-j\theta} \right|^2 + \left| \frac{V_{2P}}{I_{2P}} - Z_{21} \frac{I_{1P}}{I_{2P}} e^{j\theta} - Z_{22} \right|^2 + \left| \frac{V_{1B}}{I_{1B}} - Z_{11} + \frac{Z_{12} Z_{21}}{Z_{22} + Z_{2B}} \right|^2 \quad [1]$$

(Expression 2)
$$\begin{pmatrix} Z_{11} & Z_{12} \\ Z_{21} & Z_{22} \end{pmatrix} = \begin{pmatrix} Z_1 + Z_3 & Z_3 \\ Z_3 & Z_2 + Z_3 \end{pmatrix}. \quad [2]$$

3. Doherty power amplifier according to claim 1, wherein when back-off of the Doherty power amplifier is X dB, input power of the main power amplifier is $P_{M\_IN}$, and input power of the auxiliary power amplifier is $P_{A\_IN}$, where X is any real number,
$P_{M\_IN} = P_{A\_IN}$, when X=0,
$P_{M\_IN} - P_{A\_IN} = 2X/3$ dB, when 0<X<6, and
$P_{M\_IN} - P_{A\_IN} = 4$ dB, when X>6.

4. The Doherty power amplifier according to claim 1 wherein the first and second lumped elements are inductors.

* * * * *